United States Patent
Ohmi et al.

(10) Patent No.: US 8,648,393 B2
(45) Date of Patent: Feb. 11, 2014

(54) TRANSISTOR AND SEMICONDUCTOR DEVICE

(75) Inventors: Tadahiro Ohmi, Miyagi (JP); Akinobu Teramoto, Miyagi (JP); Rihito Kuroda, Miyagi (JP)

(73) Assignees: National University Corporation Tohoku University, Miyagi (JP); Foundation for Advancement of International Science, Ibaraki (JP)

( * ) Notice: Subject to any disclaimer, the term of this patent is extended or adjusted under 35 U.S.C. 154(b) by 67 days.

(21) Appl. No.: 13/372,159

(22) Filed: Feb. 13, 2012

(65) Prior Publication Data

US 2012/0146102 A1    Jun. 14, 2012

Related U.S. Application Data

(62) Division of application No. 12/309,244, filed as application No. PCT/JP2007/063927 on Jul. 12, 2007, now Pat. No. 8,138,527.

(30) Foreign Application Priority Data

Jul. 13, 2006   (JP) ................... 2006-192815

(51) Int. Cl.
  *H01L 27/148*   (2006.01)
(52) U.S. Cl.
  USPC .............. 257/218; 257/255; 257/E29.003
(58) Field of Classification Search
  USPC ............. 257/64, 218, 255, 347, E29.003, 257/E29.004
  See application file for complete search history.

(56) References Cited

U.S. PATENT DOCUMENTS

| | | | |
|---|---|---|---|
| 5,111,260 A | 5/1992 | Malhi et al. | |
| 6,806,128 B2 | 10/2004 | Ootsuka et al. | |
| 6,911,383 B2 | 6/2005 | Doris et al. | |
| 2003/0183876 A1* | 10/2003 | Takafuji et al. | 257/347 |
| 2004/0004252 A1* | 1/2004 | Madurawe | 257/347 |
| 2004/0079997 A1* | 4/2004 | Miura | 257/347 |
| 2004/0266076 A1* | 12/2004 | Doris et al. | 438/157 |
| 2006/0071291 A1 | 4/2006 | Yagishita | |

FOREIGN PATENT DOCUMENTS

| | | |
|---|---|---|
| EP | 0 377 084 A1 | 7/1990 |
| EP | 1 976 017 | 10/2008 |
| JP | 2002-026313 | 1/2002 |
| JP | 2002-110586 | 4/2002 |
| JP | 2004-146550 | 5/2004 |
| JP | 2005-019996 | 1/2005 |
| WO | WO-2004/015780 A1 | 2/2004 |
| WO | WO-2007/072844 | 6/2007 |

OTHER PUBLICATIONS

Chen, J.Y., CMOS Devices and Technology for VLSI, ISBN 0-13-138140-7, 1990, Chapter 2, 1990, p. 30 (2 pages).

(Continued)

*Primary Examiner* — Benjamin Sandvik
*Assistant Examiner* — Leslie Pilar Cruz
(74) *Attorney, Agent, or Firm* — Foley & Lardner LLP

(57) ABSTRACT

An accumulation mode transistor has an impurity concentration of a semiconductor layer in a channel region at a value higher than $2\times10^{17}$ cm$^{-3}$ to achieve a large gate voltage swing.

12 Claims, 21 Drawing Sheets

Accumulation -Mode

(56) References Cited

OTHER PUBLICATIONS

Taiwan Office Action; issued Feb. 25, 2013; 5 pages.

Chaudhry et al., "Controlling Short-Channel Effects in Deep-Submicron SOI MOSFETs for Improved Reliability: A Review," IEEE Transactions on Device and Materials Reliability, Mar. 1, 2004, 4(1):99-109.

Connelly et al., "Fermi-level depinning for low-barrier Schottky source/drain transistors," Applied Physics Letters, Jan. 4, 2006, 88(1):012105-1-012105-3.

Dubois et al,. "Low Schottky barrier source/drain for advanced MOS architecture: device design and material considerations," Solid-State Electronics, Jul. 1, 2002, 46(7):997-1004.

Laszcz et al., "Transmission electron microscopy of iridium silicide contacts for advanced MOFSET structures with Schottky source and drain," Journal of Alloys and compounds, Nov. 17, 2004, 382(1-2):24-28.

Park et al., "Accumulation-Mode Pi-gate MOFSET," Proceedings of the 2003 IEEE International SOI Conference, Sep. 29-Oct. 2, 2003, Newport Beach, California, 65-67.

Supplementary European Search Report dated Apr. 14, 2011, in corresponding EP 07790721.0, 11 pages.

\* cited by examiner

Inversion -Mode

Inversion -Mode

Accumulation -Mode

NOR

TRANSISTOR AND SEMICONDUCTOR DEVICE

CROSS-REFERENCE TO RELATED PATENT APPLICATIONS

This application is a division of application Ser. No. 12/309,244 filed on Jan. 12, 2009; which is a continuation of International Application No. PCT/JP2007/063927, filed on Jul. 12, 2007, and claims priority to Japanese Patent Application No. 2006-192815, filed on Jul. 13, 2006. The contents of the foregoing applications are incorporated by reference in their entirety.

TECHNICAL FIELD

This invention relates to a transistor and a semiconductor device such as an IC or an LSI.

BACKGROUND ART

Conventionally, inversion-mode transistors have been widely used in semiconductor devices such as ICs and LSIs. In an inversion-mode transistor, the directions of effective electric fields applied to a gate insulating film and a channel region are the same, respectively, in the on and off states of the transistor. This is because, in order to turn on the inversion-mode transistor, it is necessary to induce charges of the same sign as that of carriers into a depletion layer until the depletion layer reaches the maximum depletion layer width, thereby forming a channel for the carriers to move therein. Accordingly, for enhancing the driving capability of a drain current (the drain current driving capability) when the transistor is in the on state, it is effective to set a voltage applied to a gate electrode as high as possible. However, in consideration of the reliability of the gate insulating film, the absolute value of an electric field that can be applied to the gate insulating film is determined to be, for example, 8 MV/cm or the like and therefore there has been a problem that, as a result thereof, the voltage swing applied to the gate electrode cannot be set large and thus the current-driving capability of the transistor cannot be enhanced.

Herein, if it is possible to enhance or improve the drain current driving capability that increases quadratically with respect to a value of difference, "gate voltage VG" minus "threshold voltage Vth," as generally given by the following formula (1), the operating speed of a circuit can be enhanced or improved.

$$I_{Dsat} = \frac{1}{2}\frac{W}{L}C_i\mu(V_G - V_{th})^2 \quad \text{[Formula 1]}$$

where IDsat is a saturated drain current, W and L a gate width and a gate length, Ci a unit capacitance of a gate insulating film, μ a mobility of an electron or a hole, VG a gate voltage applied to a gate electrode, and Vth a threshold voltage. The fact that the voltage swing applied to the gate electrode cannot be set large represents that "gate voltage VG" minus "threshold voltage Vth" cannot be set large, and therefore, as a result thereof, there has been a limit to the improvement in drain current driving capability and the improvement in the operating speed of a circuit.

On the other hand, accumulation-mode transistors are also known. However, a conventionally proposed accumulation-mode transistor is configured to realize normally-off by reducing the impurity concentration of a channel region to less than $2\times10^{17}$ cm$^{-3}$. In the channel region of such an accumulation-mode transistor, a current amount flowing in a semiconductor substrate becomes sufficiently small as compared with a current amount flowing in an accumulation layer near the interface between a gate insulating film and a semiconductor and thus on/off cannot be controlled by the current flowing in the semiconductor substrate. Since it is necessary to sufficiently induce carriers into the accumulation layer for turning on the transistor, the directions of effective electric fields applied to the gate insulating film and the silicon channel become the same, respectively, when the voltage applied to a gate electrode is at a threshold value representing the boundary between on and off and after the transistor is turned on, and thus the voltage swing applied to the gate electrode cannot be set large, similarly to the inversion-mode transistor.

DISCLOSURE OF THE INVENTION

It is an exemplary object of this invention to provide a transistor in which a large voltage swing can be applied to a gate electrode.

It is another exemplary object of this invention to provide a transistor in which a large voltage swing can be applied to a gate electrode and thus the current-driving capability can be enhanced.

The present inventors have newly found that it is possible to increase a voltage swing applied to a gate electrode by causing the direction of the effective electric field applied to a gate insulating film and a semiconductor layer of a channel in the on state of a transistor to be opposite to that in the off state of the transistor and that this can be achieved only by using an accumulation-mode transistor, and have reached this invention.

Hereinbelow, aspects of this invention will be enumerated.

[First Aspect]

An accumulation-mode transistor comprises a channel region and a source region and a drain region formed at both ends of the channel region. The channel region has an impurity concentration higher than $2\times10^{17}$ cm$^{-3}$ and the channel region is formed of an n-type semiconductor with electrons used as carriers or the channel region is formed of a p-type semiconductor with holes used as carriers.

[Second Aspect]

In the first aspect, the source region and the drain region are formed of a semiconductor of the same conductivity type as that of the channel region.

[Third Aspect]

In the first aspect, the source region and the drain region are formed of a metal or a metal-semiconductor compound having a work function with a difference of 0.32 eV or less with respect to a work function of the semiconductor of the channel region.

[Fourth Aspect]

In the third aspect, the channel region is formed of n-type silicon and the source region and the drain region are formed of a metal or a metal-semiconductor compound having a work function of −4.37 eV or more.

[Fifth Aspect]

In the third aspect, the channel region is formed of p-type silicon and the source region and the drain region are formed of a metal or a metal-semiconductor compound having a work function of −4.95 eV or less.

[Sixth Aspect]

In any one of the first through fifth aspects, the transistor is of a normally-off type.

[Seventh Aspect]

In the sixth aspect, the channel region is formed by an SOI layer and a thickness of the SOI layer is smaller than the thickness of a depletion layer which is formed in a semiconductor layer of the channel region at a contact portion between the channel region and the source region when a voltage applied to the drain electrode changes from 0V to a power supply voltage while a voltage applied to the gate electrode is equal to a voltage applied to the source electrode.

[Eighth Aspect]

In the seventh aspect, the thickness of the SOI layer, an impurity concentration of the SOI layer, and a work function of the gate electrode over the channel region are determined in such a manner that the depletion layer formed in the semiconductor layer of the channel region at the contact portion between the channel region and the source region by a work function difference between the gate electrode provided on the gate insulating film and the semiconductor layer of the channel region is formed continuously in a depth direction of the semiconductor layer when the voltage applied to the drain electrode changes from 0V to the power supply voltage while the voltage applied to the gate electrode is equal to the voltage applied to the source electrode.

[Ninth Aspect]

In any one of the first through eighth aspects, the impurity concentration of the channel region is $1 \times 10^{18}$ cm$^{-3}$ to $5 \times 10^{19}$ cm$^{-3}$.

[Tenth Aspect]

An accumulation-mode CMOS semiconductor device includes at least two transistors each according to any one of the first through ninth aspects, one of the two transistors is an n-channel transistor and the other is a p-channel transistor.

[Eleventh Aspect]

In the tenth aspect, at least a part of a channel region of each of the n-channel transistor and the p-channel transistor has a (100) plane or a plane within ±10° from the (100) plane.

[Twelfth Aspect]

In the tenth aspect, at least a part of a channel region of each of the n-channel transistor and the p-channel transistor has a (110) plane or a plane within ±10° from the (110) plane.

[Thirteenth Aspect]

In the tenth aspect, at least a part of a channel region of the n-channel transistor has a (100) plane or a plane within ±10° from the (100) plane and at least a part of a channel region of the p-channel transistor has a (110) plane or a plane within ±10° from the (110) plane.

According to this invention, there is an effect that since the directions of effective electric fields applied to a gate insulating film and a semiconductor layer of a channel region become opposite to each other, respectively, in the on and off states of a transistor, the voltage swing applied to a gate electrode can be set large and thus there are obtained the improvement in drain current driving capability and the improvement in circuit operating speed.

BEST MODE FOR CARRYING OUT THE INVENTION

Figure 1:
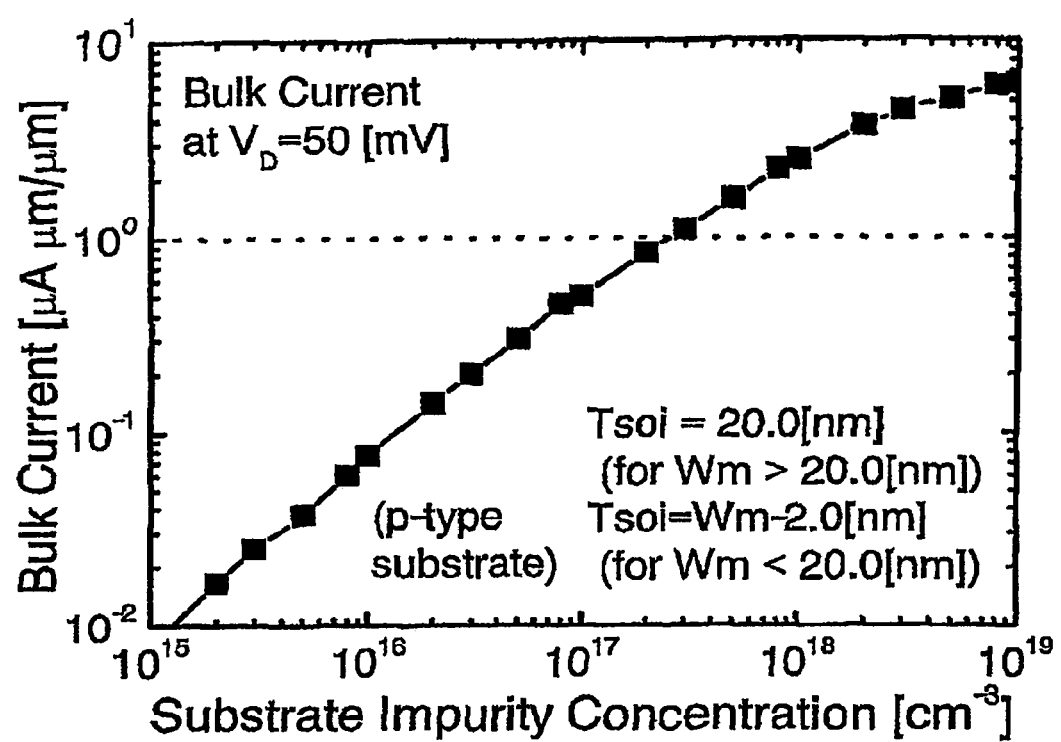
FIG. 1 is a diagram showing, in accumulation-mode transistors, the relationship between the impurity concentration in a semiconductor layer and the current flowing through a channel when a flatband voltage is applied to a gate electrode and 50 mV with respect to a source voltage in the case of n-channel or −50 mV with respect to a source voltage in the case of p-channel is applied to a drain electrode.

FIG. 1 shows, with respect to accumulation-mode MOSFETs, the relationship between the impurity concentration in a semiconductor layer and the current flowing in the semiconductor layer when a flatband voltage is applied to a gate electrode and 50 mV is applied to a drain electrode. The thickness of the semiconductor layer is selected so that the accumulation-mode MOSFET becomes normally off. When realizing a short-channel MOSFET with a channel length of about 45 nm, the thickness of a semiconductor layer is preferably 20 nm or less. Therefore, when the maximum depletion layer width determined by the impurity concentration is 20 nm or more, the thickness of the semiconductor layer is set to 20 nm. As shown in FIG. 1, if the impurity concentration is higher than $2 \times 10^{17}$ cm$^{-3}$, a drain current of 1 µA generally determined to be a reference value of a threshold value flows when the flatband voltage is applied to the gate electrode, and thus, the control of a threshold value can be performed by a current flowing in a semiconductor substrate layer, i.e. not by a current flowing in an accumulation layer in the semiconductor layer. That is, if the impurity concentration in the semiconductor layer is higher than $2 \times 10^{17}$ cm$^{-3}$, the electric field applied to a gate insulating film when a gate voltage corresponding to a threshold value is applied becomes 0 MV/cm or less and thus the directions of effective electric fields applied to the gate insulating film and the silicon channel can be opposite to each other, respectively, in the on and off states. Therefore, as compared with the conventional transistors, it is possible to increase the gate voltage at which the transistor reaches the same gate insulating film electric field. If the voltage applied to the gate electrode can be set higher, it is possible to quadratically improve the drain current driving capability as given by the formula (1). Further, by increasing the impurity concentration in the semiconductor layer of the accumulation-mode MOSFET, it is possible not only to control the threshold value by the current flowing in the semiconductor substrate, but also to increase the on-current.

The impurity concentration in the semiconductor layer preferably falls within a range of $1 \times 10^{18}$ cm$^{-3}$ to $5 \times 10^{19}$ cm$^{-3}$ and, if the impurity concentration increases to exceed this range, it becomes difficult to realize normally-off. This is because it becomes more difficult for a depletion layer to extend as the impurity concentration increases.

First Embodiment

Figure 3A:
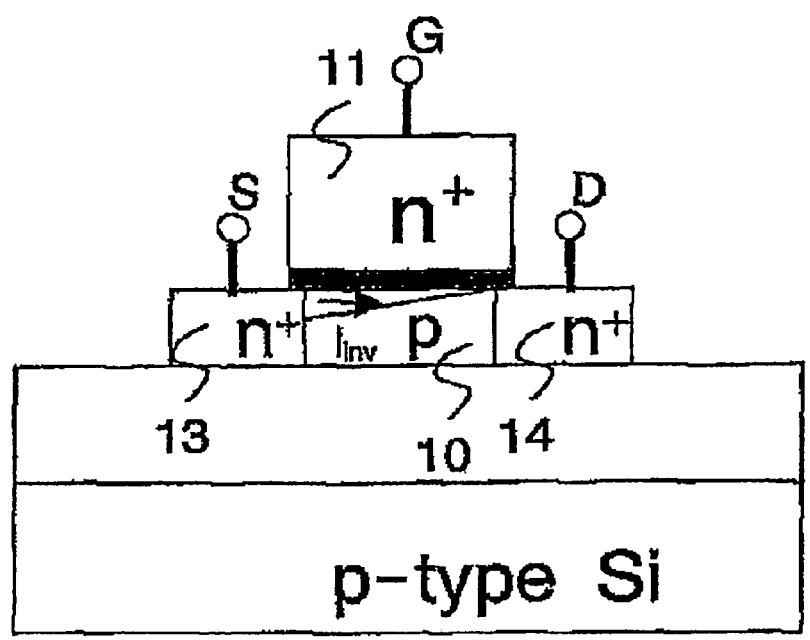
FIG. 3A is a diagram exemplarily illustrating the structure of an inversion-mode n-channel transistor.
Figure 3B:
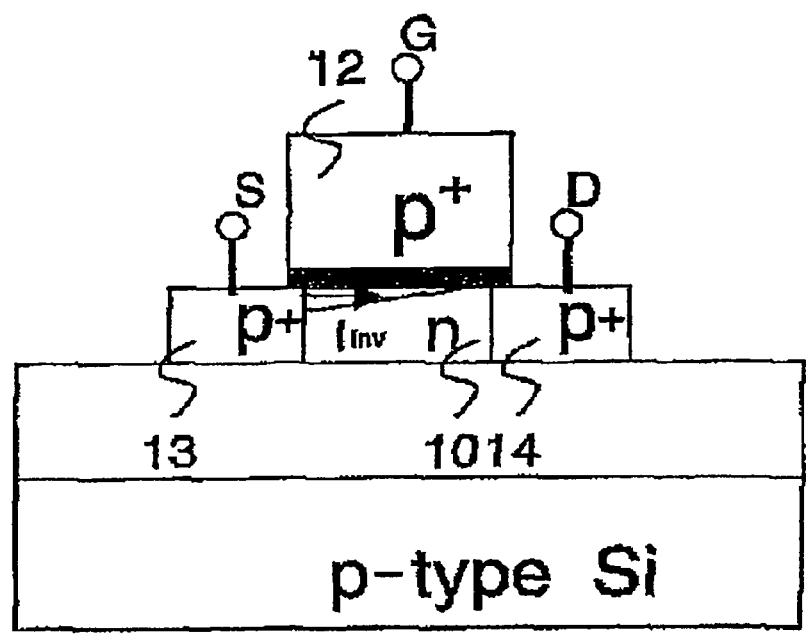
FIG. 3B is a diagram exemplarily illustrating the structure of an inversion-mode p-channel transistor.
Figure 3C:
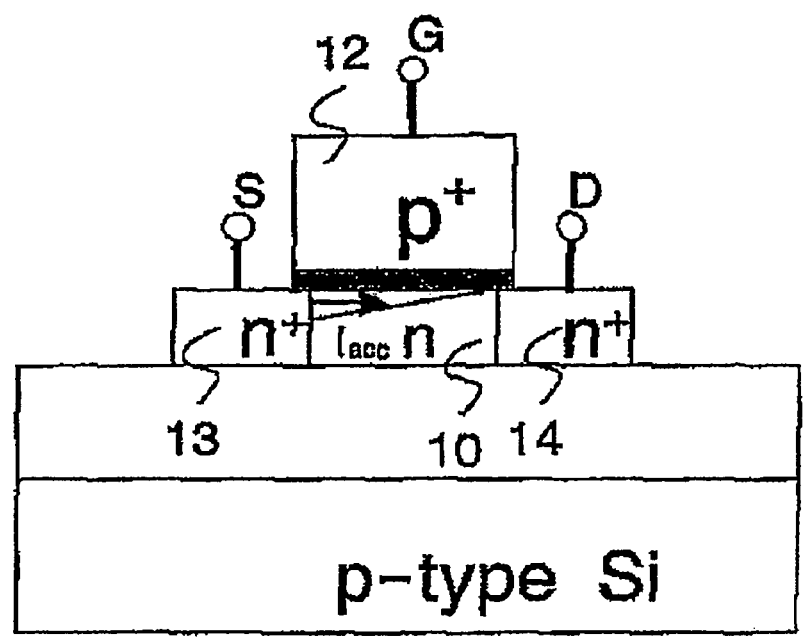
FIG. 3C is a diagram exemplarily illustrating the structure of an accumulation-mode n-channel transistor according to this invention.
Figure 3D:
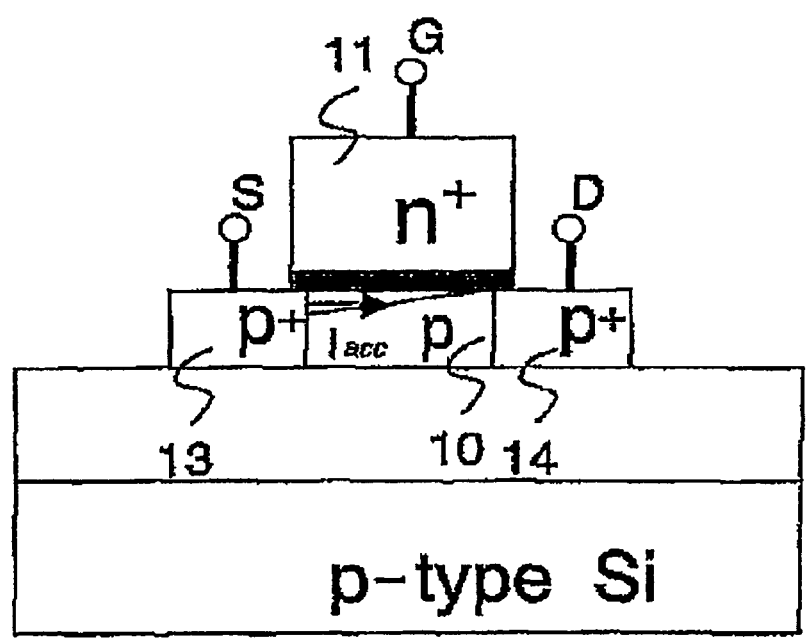
FIG. 3D is a diagram exemplarily illustrating the structure of an accumulation-mode p-channel transistor according to this invention.

FIGS. 3A and 3B illustrate inversion-mode n-channel transistor and p-channel transistor each having a channel region formed by an SOI (Silicon on Insulator) layer 10 having the surface on the (100) surface orientation. FIGS. 3C and 3D illustrate accumulation-mode n-channel transistor and p-channel transistor each having a channel region formed by an SOI layer 10. Hereinafter, the SOI layer 10 may be called a semiconductor layer.

In each of FIGS. 3A to 3D, the average impurity concentration in a channel and depletion layer region of the semiconductor layer 10 is $2 \times 10^{17}$ cm$^{-3}$ and the thickness of the semiconductor layer 10 is 20 nm. A gate insulating film is 1 nm in terms of an electrical equivalent thickness (EOT). Herein, the surface of the channel region has been subjected to a flattening process so as to have a peak-to-valley of 0.16 nm or less and thus the interface between the gate insulating film and the channel region is extremely flat on the atomic order. Gate electrodes 11 and 12 are n$^+$ polysilicon in FIGS. 3A and 3D and p$^+$ polysilicon in FIGS. 3B and 3C. The gate length is 45 nm and the effective gate length is 29 nm. The gate width is 1.0 µm. Source and drain layers 13 and 14 each have a thickness of 5 nm at its lateral portion contacting the channel region and are each formed of a semiconductor having an impurity concentration of $2 \times 10^{20}$ cm$^{-3}$ and a metal-semiconductor compound. Herein, the metal-semiconductor compound is Mg silicide in FIGS. 3A and 3C and Ir silicide in FIGS. 3B and 3D. In any case, the contact resistance with the semiconductor is suppressed to $1 \times 10^{-11}$ Ωcm$^2$ or less and the series resistance of the transistor in total of the contact resistance and a series resistance of the semiconductor portion of the source sand drain regions is 1.0Ωµm.

Herein, the source and drain layers 13 and 14 may be formed of a metal or a metal-semiconductor compound having a work function of −4.37 eV or more in FIGS. 3A and 3C and may be formed of a metal or a metal-semiconductor compound having a work function of −4.95 eV or less in FIGS. 3B and 3D. It is preferable that the source and drain layers 13 and 14 be formed of a metal or a metal-semiconductor compound having a work function with a difference of 0.32 eV or less with respect to a work function of a semiconductor of the channel region. This is because if the difference between the above work functions is 0.32 eV or less, the source or drain contact resistance can be set to $1 \times 10^{-10}$ Ωcm$^2$ or less. If the contact resistance is the above value or less, there are obtained characteristics substantially the same as those under the ideal conditions. In FIGS. 3C and 3D, when a voltage applied to a drain electrode changes from 0V to a power supply voltage while a voltage applied to the gate electrode is equal to a voltage applied to a source electrode, the thickness of a depletion layer formed in the semiconductor layer of the channel region at a contact portion between the channel region and the source region is greater than 20 nm so that normally-off is realized. In other words, a depletion layer formed in the semiconductor layer of the channel region at the contact portion between the channel region and the source region by a work function difference between the gate electrode provided on the gate insulating film and the semiconductor layer is continuous in the depth direction of the semiconductor layer, thereby realizing normally-off.

Figure 4A:
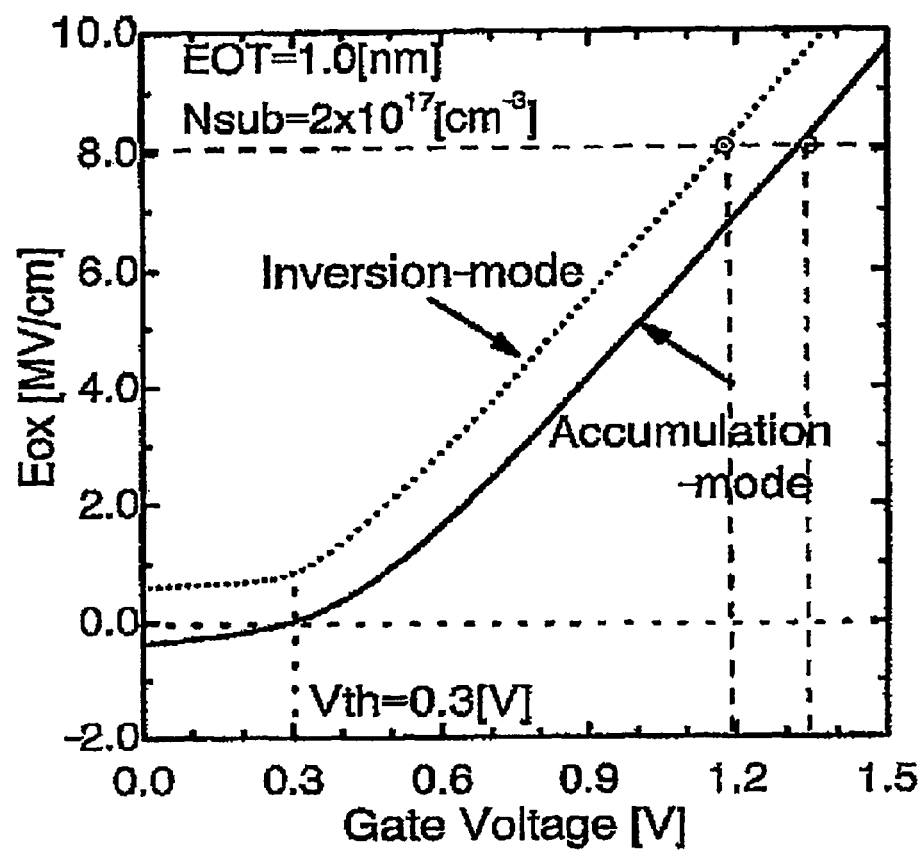
FIG. 4A is a diagram showing the voltage applied to gate electrodes, the electric field applied to gate insulating films, and the electric field effectively applied to silicon channel regions of an inversion-mode n-channel transistor and an accumulation-mode n-channel transistor according to this invention each having a semiconductor layer with an impurity concentration of $2 \times 10^{17}$ cm$^{-3}$.
Figure 4B:
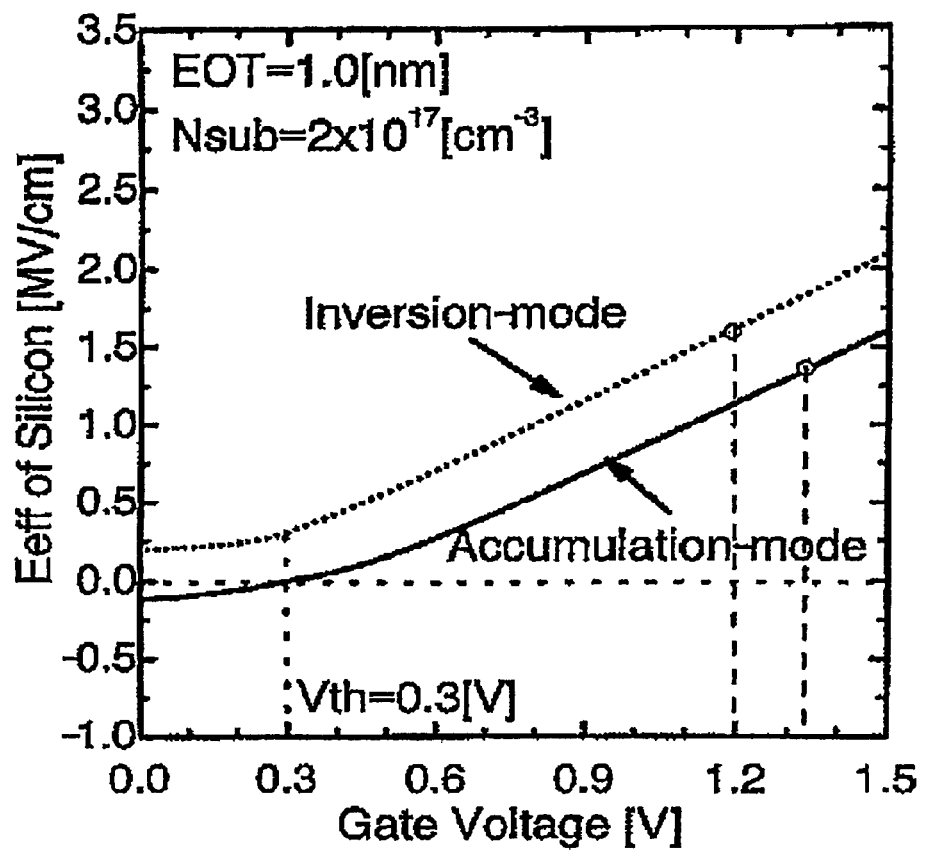
FIG. 4B is a diagram showing the voltage applied to gate electrodes, the electric field applied to gate insulating films, and the electric field effectively applied to silicon channel regions of an inversion-mode n-channel transistor and an accumulation-mode n-channel transistor according to this invention each having a semiconductor layer with an impurity concentration of $2 \times 10^{17}$ cm$^{-3}$.

FIGS. 4A and 4B show the relationships between the gate voltage of the above accumulation-mode n-channel transistor and the above inversion-mode n-channel transistor, the electric field applied to the gate insulating films thereof, and the electric field effectively applied to the channels thereof. Since the normally-off accumulation-mode MOSFET achieves normally-off by setting the thickness of the SOI layer to be smaller than the width of a depletion layer in the off state, the directions of electric fields applied to the gate insulating film are opposite to each other in the off state and the on state. Accordingly, when the accumulation-mode transistor and the inversion-mode transistor have the same threshold voltage, the accumulation-mode transistor has, as compared with the inversion-mode transistor, a higher gate voltage at which the same gate insulating film electric field is reached. Therefore, when the maximum allowable value of operating voltage is defined by a gate insulating film electric field, the operating voltage can be set higher in the accumulation-mode transistor than in the inversion-mode transistor and thus the speed-up can be achieved. In the case of the above inversion-mode transistor and accumulation-mode transistor, when the threshold value is set to 0.3V and the maximum allowable value of power source voltage is defined as a gate voltage at which the gate insulating film electric field becomes 8 MV/cm, the gate voltage becomes 1.2V in an inversion-mode CMOS and 1.35V in an accumulation-mode CMOS and thus the current driving capability of the accumulation-mode CMOS is improved 1.4 times from the formula (1).

Further, in the accumulation-mode MOSFET, there is no depletion layer charge present in the accumulation state, i.e. in the on state. Therefore, when the densities of carriers present in the channel regions of the inversion-mode MOSFET and the accumulation-mode MOSFET to contribute to electrical conduction are equal to each other, the electric field applied to the semiconductor channel portion in a direction perpendicular to the gate insulating film can be suppressed in the accumulation-mode MOSFET than in the inversion-mode MOSFET. Herein, the relationship between the electric field applied to the silicon channel portion and the density of carriers contributing to conduction is given by the following formula (2) in the case of the inversion-mode transistor and by the following formula (3) in the case of the accumulation-mode transistor.

$$E_{eff} = \frac{1}{\varepsilon_{si}}\left(\frac{1}{\eta}Q_{inversion} + Q_{depletion}\right) \quad \text{[Formula 2]}$$

$$E_{eff} = \frac{1}{\varepsilon_{si}}\left(\frac{1}{\eta}Q_{accumulation}\right) \quad \text{[Formula 3]}$$

where Eeff is an effective electric field applied to a channel region, εsi a permittivity of silicon, Qinversion and Qaccumulation each a contributing carrier density, and Qdepletion a charge density present in a depletion layer. The electron/hole mobility of silicon has a negative slope with respect to an electric field applied to a silicon channel portion near a bias point determining the on-current driving capability of a transistor. Accordingly, with the same density of carriers contributing to conduction, the effective electric field applied to the silicon channel can be suppressed in the accumulation-mode MOSFET than in the inversion-mode MOSFET. Therefore, the accumulation-mode MOSFET can operate in a region with a larger mobility as compared with the inversion-mode MOSFET and thus can achieve the speed-up. In the case of the above inversion-mode CMOS and accumulation-mode CMOS, if the gate voltage is 1.2V in the inversion-mode CMOS and 1.35V in the accumulation-mode CMOS, the electron mobility becomes 240 cm²/Vsec in the inversion-mode CMOS and 254 cm²/Vsec in the accumulation-mode CMOS. Accordingly, the current driving capability of the accumulation-mode CMOS becomes 1.06 times from the formula (1) only by the improvement caused by the mobility.

Figure 2:
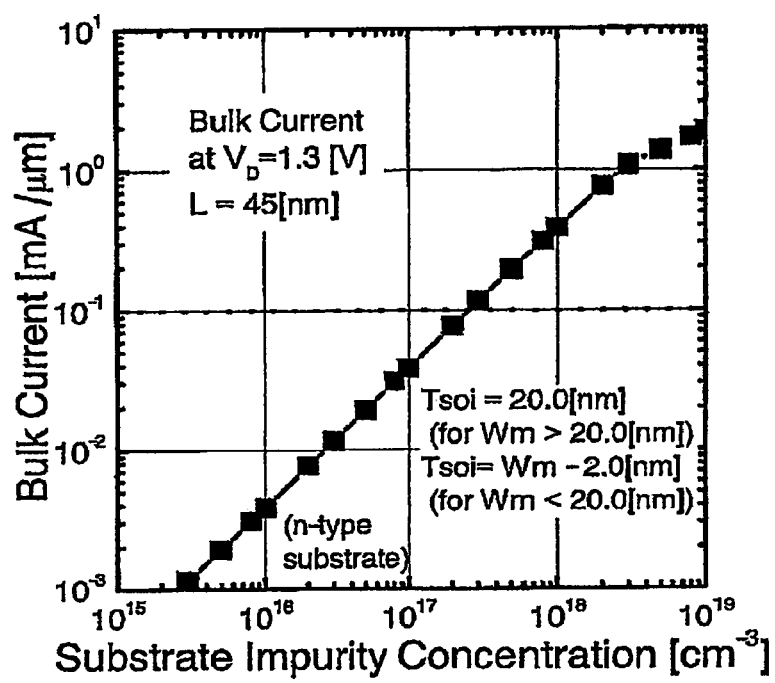
FIG. 2 is a diagram showing, in accumulation-mode transistors with a channel length of 45 nm, the relationship between the impurity concentration in a semiconductor layer and the current flowing through a channel when an on-voltage exceeding a threshold value is applied to a gate electrode and 1V with respect to a source voltage in the case of n-channel or −1V with respect to a source voltage in the case of p-channel is applied to a drain electrode.

Further, in the accumulation-mode MOSFET, since the substrate current also flows in the substrate region other than the accumulation layer in the on state, it is possible to achieve further improvement in current driving capability and operating speed. Herein, FIG. 2 shows, with respect to accumulation-mode MOSFETs having a gate length of 45 nm, the relationship between the impurity concentration in a semiconductor layer and the current flowing in the semiconductor layer when an on-voltage is applied to a gate electrode and 1.0V is applied to a drain electrode. The thickness of the semiconductor layer is selected so that the accumulation-mode MOSFET becomes normally off. When realizing a short-channel MOSFET with a channel length of about 45 nm, the thickness of a semiconductor layer is preferably 20 nm or less. Therefore, when the maximum depletion layer width determined by the impurity concentration is 20 nm or more, the thickness of the semiconductor layer is set to 20 nm. From FIG. 2, the substrate current is 0.1 mA/μm in the above accumulation-mode transistor and, as compared with a maximum saturation current of 4.5 mA/μm in the above inversion-mode transistor, the current driving capability is improved by about 2%. Accordingly, taking into account all the factors, i.e. the operating voltage, the mobility, and the substrate current, the current driving capability of the accumulation-mode CMOS is about 1.5 times that of the inversion-mode CMOS.

Figure 5A:
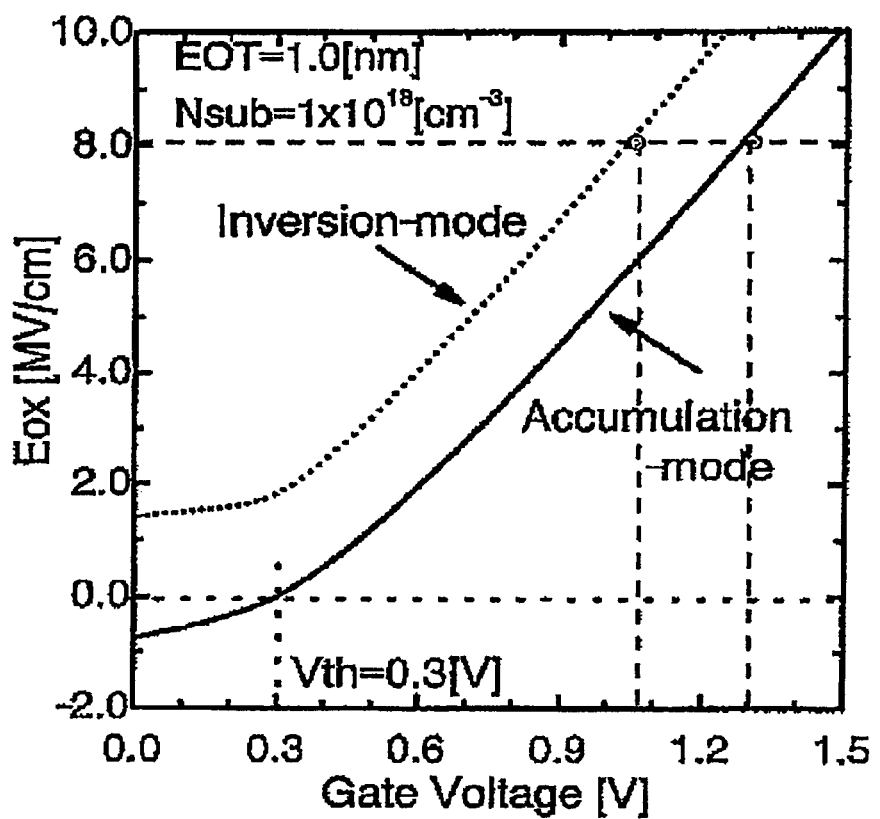
FIG. 5A is a diagram showing the voltage applied to gate electrodes, the electric field applied to gate insulating films, and the electric field effectively applied to silicon channel regions of an inversion-mode n-channel transistor and an accumulation-mode n-channel transistor according to this invention each having a semiconductor layer with an impurity concentration of $1 \times 10^{18}$ cm$^{-3}$.
Figure 5B:
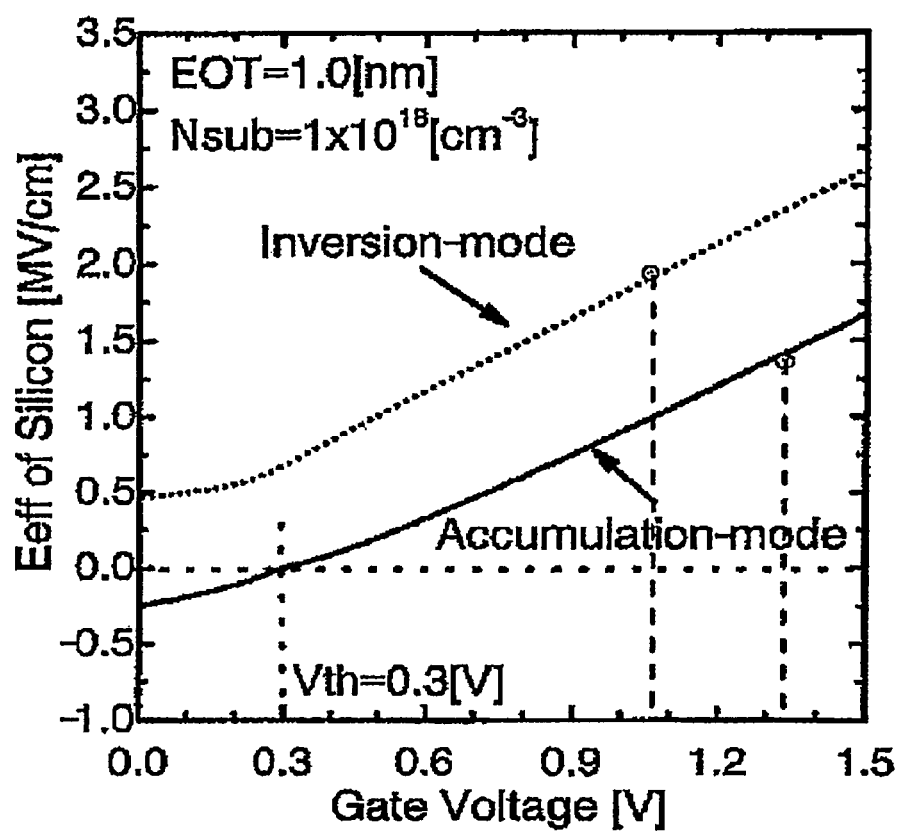
FIG. 5B is a diagram showing the voltage applied to gate electrodes, the electric field applied to gate insulating films, and the electric field effectively applied to silicon channel regions of an inversion-mode n-channel transistor and an accumulation-mode n-channel transistor according to this invention each having a semiconductor layer with an impurity concentration of $1 \times 10^{18}$ cm$^{-3}$.

Herein, when the impurity concentration in the semiconductor layers is set to $1 \times 10^{18}$ cm$^{-3}$ in FIGS. 3A to 3D, the relationships between the gate voltage of the above accumulation-mode n-channel transistor and the above inversion-mode n-channel transistor, the electric field applied to the gate insulating films thereof, and the electric field effectively applied to the channels thereof become as shown in FIGS. 5A and 5B. In the case of the above inversion-mode transistor and accumulation-mode transistor, when the threshold value is set to 0.3V and the maximum allowable value of power source voltage is defined as a gate voltage at which the gate insulating film electric field becomes 8 MV/cm, the gate voltage becomes 1.05V in an inversion-mode CMOS and 1.30V in an accumulation-mode CMOS and thus the current driving capability of the accumulation-mode CMOS is improved 1.8 times from the formula (1). In the case of the above inversion-mode CMOS and accumulation-mode CMOS, given that the gate voltage is 1.05V in the inversion-mode CMOS and 1.30V in the accumulation-mode CMOS, the electron mobility becomes 225 cm²/Vsec in the inversion-mode CMOS and 250 cm²/Vsec in the accumulation-mode CMOS. Accordingly, the current driving capability of the accumulation-mode CMOS becomes 1.1 times from the formula (1) only by the improvement caused by the mobility. Further, in the above accumulation-mode transistor, the substrate current is 0.4 mA/μm and thus the current driving capability is improved by about 9%. Accordingly, taking into account all the factors, i.e. the operating voltage, the mobility, and the substrate current, the current driving capability of the accumulation-mode CMOS is about 2.1 times that of the inversion-mode CMOS.

Figure 6A:
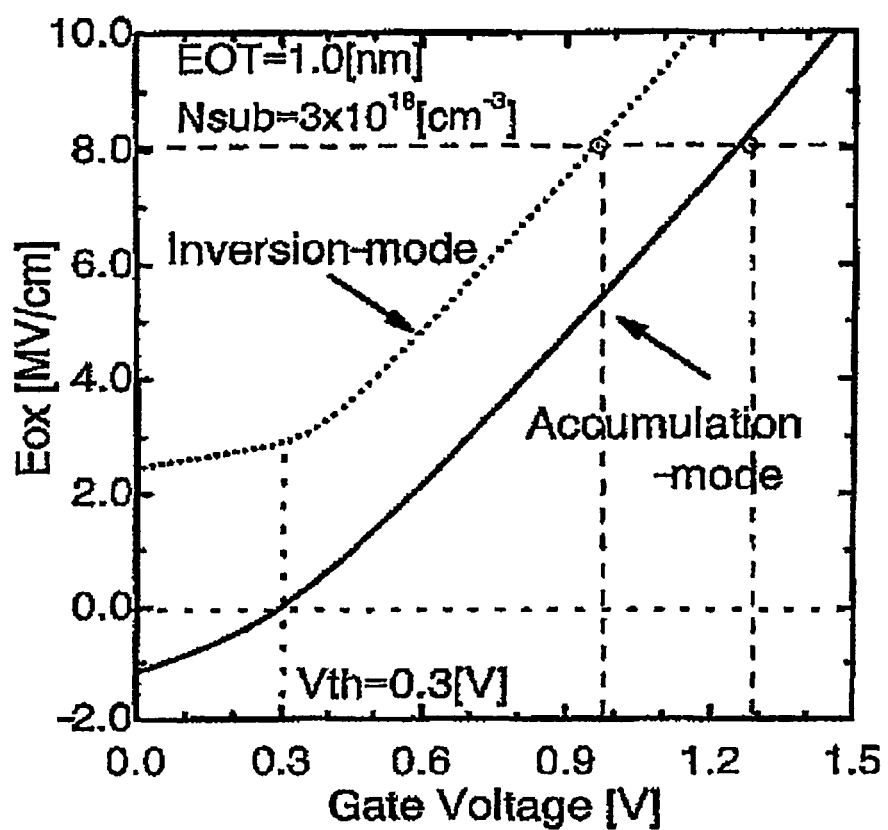
FIG. 6A is a diagram showing the voltage applied to gate electrodes, the electric field applied to gate insulating films, and the electric field effectively applied to silicon channel regions of an inversion-mode n-channel transistor and an accumulation-mode n-channel transistor according to this invention each having a semiconductor layer with an impurity concentration of $3 \times 10^{18}$ cm$^{-3}$.
Figure 6B:
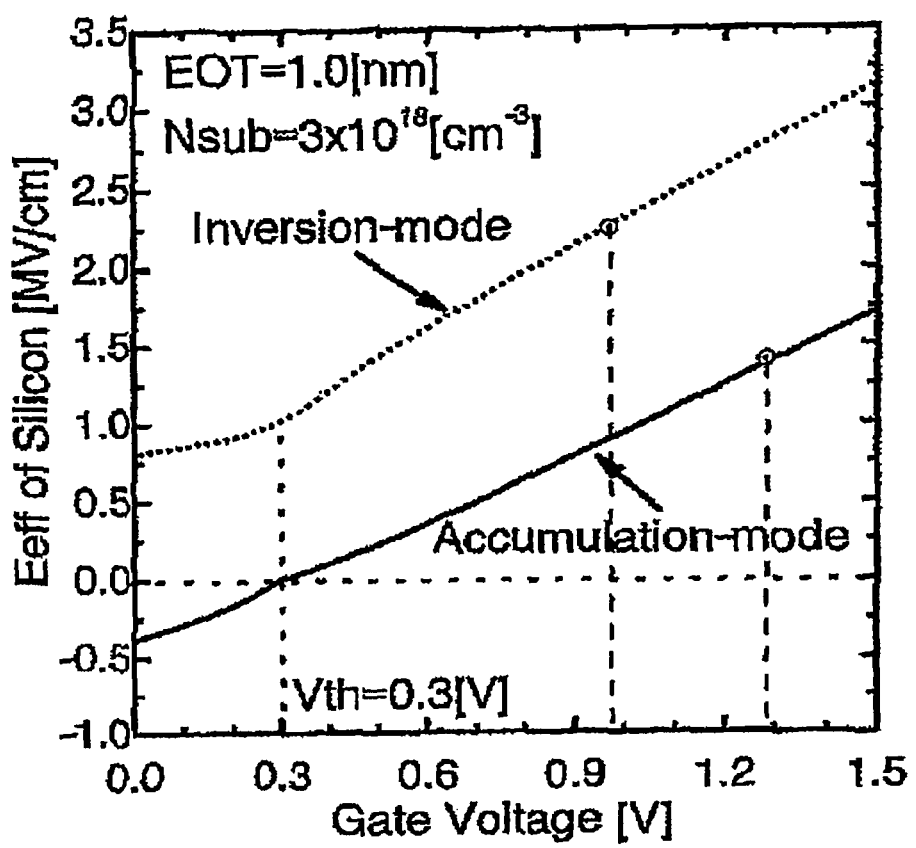
FIG. 6B is a diagram showing the voltage applied to gate electrodes, the electric field applied to gate insulating films, and the electric field effectively applied to silicon channel regions of an inversion-mode n-channel transistor and an accumulation-mode n-channel transistor according to this invention each having a semiconductor layer with an impurity concentration of $3 \times 10^{18}$ cm$^{-3}$.

FIGS. 6A and 6B show the relationships between the gate voltage of the above accumulation-mode n-channel transistor and the above inversion-mode n-channel transistor, the electric field applied to the gate insulating films thereof, and the electric field effectively applied to the channels thereof when the impurity concentration in the semiconductor layers is set to $3 \times 10^{18}$ cm$^{-3}$ and the thickness thereof is set to 10 nm in FIGS. 3A to 3D. In the case of the above inversion-mode transistor and accumulation-mode transistor, when the threshold value is set to 0.3V and the maximum allowable value of power source voltage is defined as a gate voltage at which the gate insulating film electric field becomes 8 MV/cm, the gate voltage becomes 1.0V in an inversion-mode CMOS and 1.3V in an accumulation-mode CMOS and thus the current driving capability of the accumulation-mode CMOS is improved 2.0 times from the formula (1). In the case of the above inversion-mode CMOS and accumulation-mode CMOS, given that the gate voltage is 1.2V in the inversion-mode CMOS and 1.3V in the accumulation-mode CMOS, the electron mobility becomes 210 $cm^2$/Vsec in the inversion-mode CMOS and 250 $cm^2$/Vsec in the accumulation-mode CMOS. Accordingly, the current driving capability of the accumulation-mode CMOS becomes 1.2 times from the formula (1) only by the improvement caused by the mobility. Further, in the above accumulation-mode transistor, the substrate current is 0.5 mA/μm and thus the current driving capability is improved by about 11%. Accordingly, taking into account all the factors, i.e. the operating voltage, the mobility, and the substrate current, the current driving capability of the accumulation-mode CMOS is about 2.7 times that of the inversion-mode CMOS.

Further, the effect that the electric field effectively applied to the silicon channel region is reduced in the accumulation-mode transistor than in the inversion-mode transistor leads to an effect that the reliability to time-dependent degradation of the current driving capability of the accumulation-mode transistor caused by the magnitude of energy of carriers in the transistor increases with respect to the inversion-mode transistor. This is because there is a correlation that the energy of carriers present in the channel region increases as the electric field effectively applied to the channel region increases.

Figure 7:
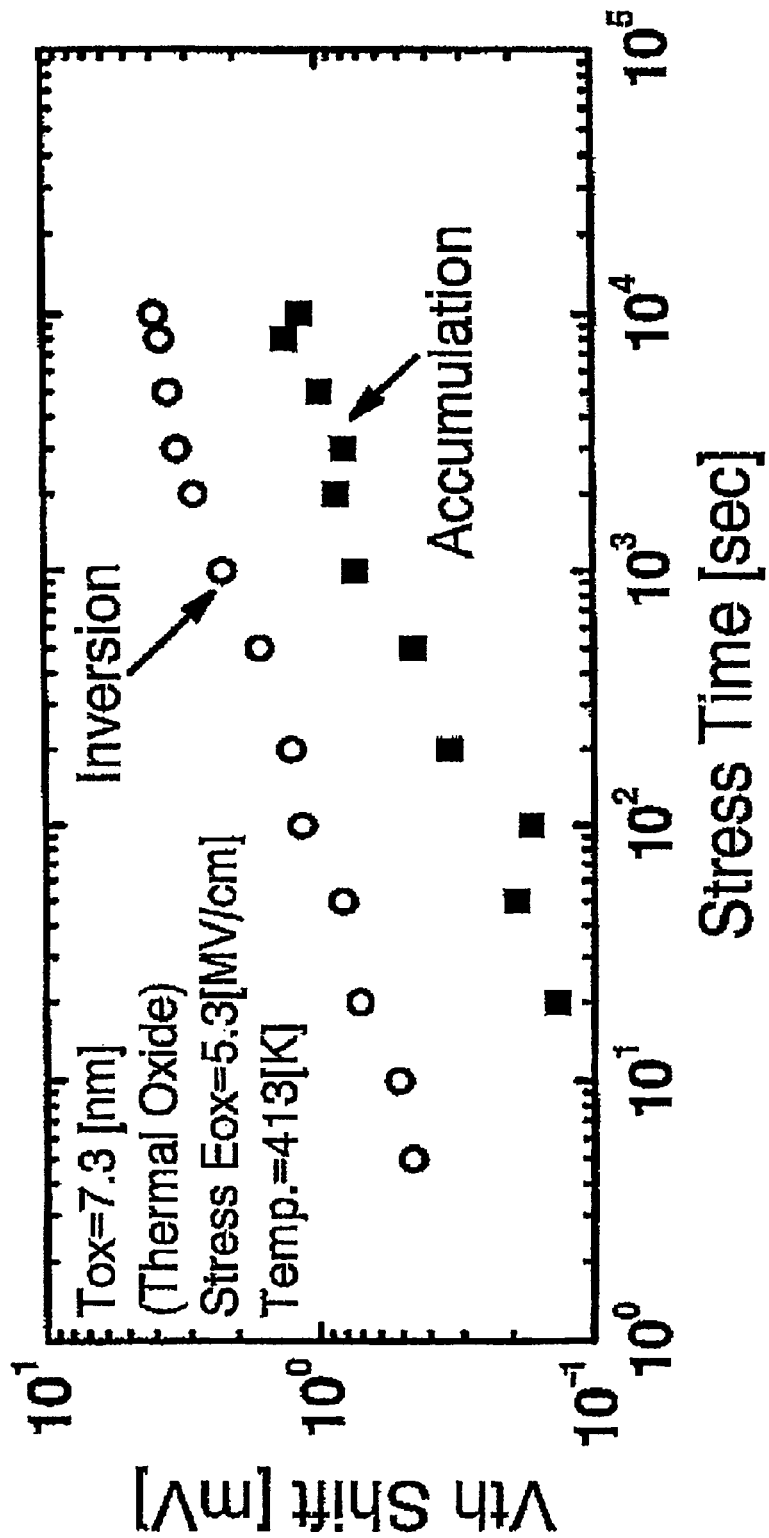
FIG. 7 is a diagram showing the results of measuring time-dependent changes in threshold value in inversion-mode and accumulation-mode p-channel transistors under electrical stress caused by the same gate insulating film electric field and temperature.

FIG. 7 is a diagram showing the immunity against the negative bias temperature instability which is a reliability problem currently serious for inversion-mode and accumulation-mode p-channel transistors. FIG. 7 particularly shows the results of applying, at the same stress temperature, the same stress electric field to gate insulating films of inversion-mode and accumulation-mode p-channel transistors having the same insulating film thickness and the same impurity concentration in semiconductor layers thereof, and measuring time-dependent changes in threshold value being one example of characteristic degradation. In the accumulation-mode transistor in which the electric field effectively applied to the silicon channel region is smaller than that in the inversion-mode transistor when the same stress electric field is applied to the gate insulating films, degradation of the threshold value for the same stress time is smaller by about one digit than that in the inversion-mode transistor. As a result, it has been found that the resistance to the electric field and temperature stress of the accumulation-mode p-channel transistor is very high as compared with that of the inversion-mode p-channel transistor.

The above description has been made based on the normally-off type, but the superiority of the maximum saturation current according to this invention also applies to the normally-on type. Further, although the description has been given of the case where the SOI layer is the (100) surface orientation, the effects equivalent to those described above are obtained in the case of any surface orientation.

Second Embodiment

Figure 8A:
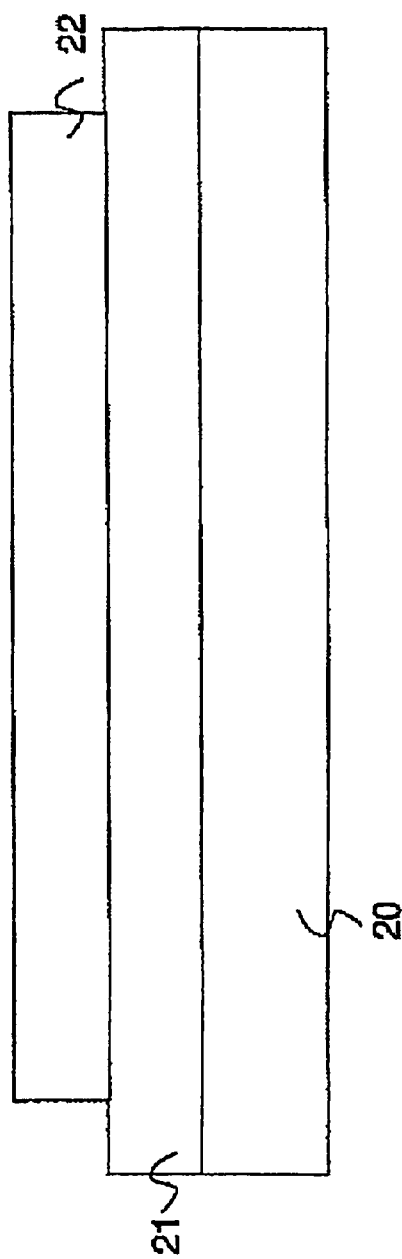
FIG. 8A illustrates an SOI substrate.
Figure 8B:
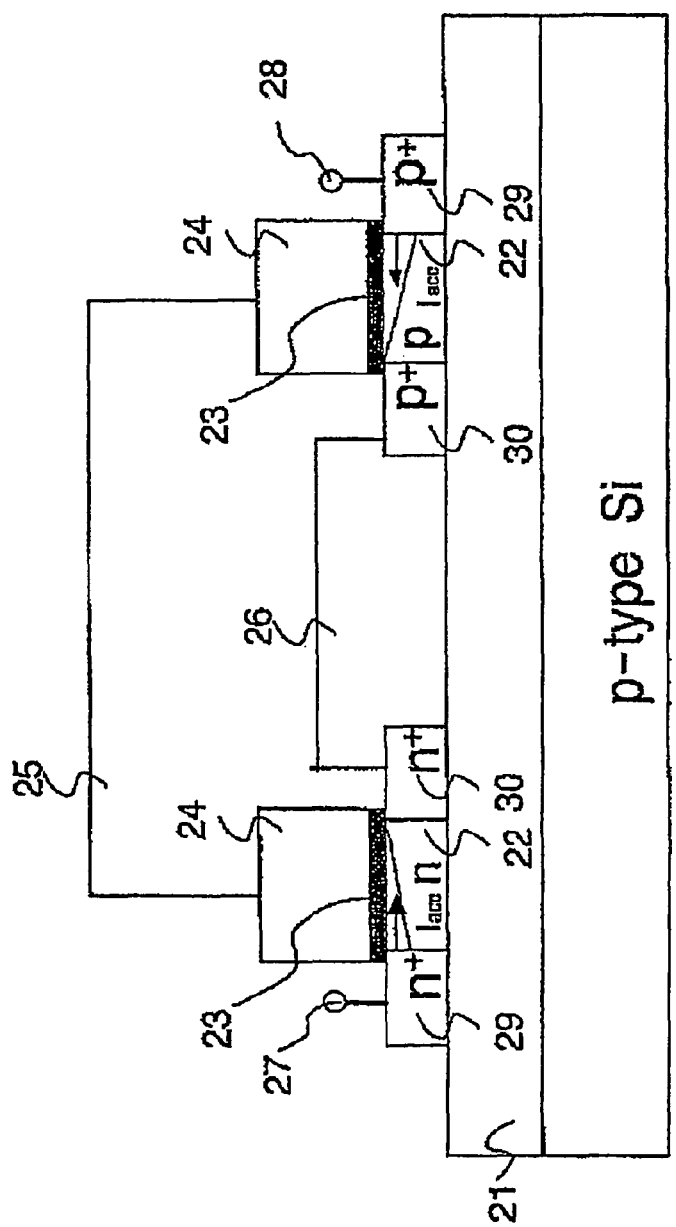
FIG. 8B is a diagram illustrating a structural example of a two-dimensional planar SOI-type CMOS.
Figure 9A:
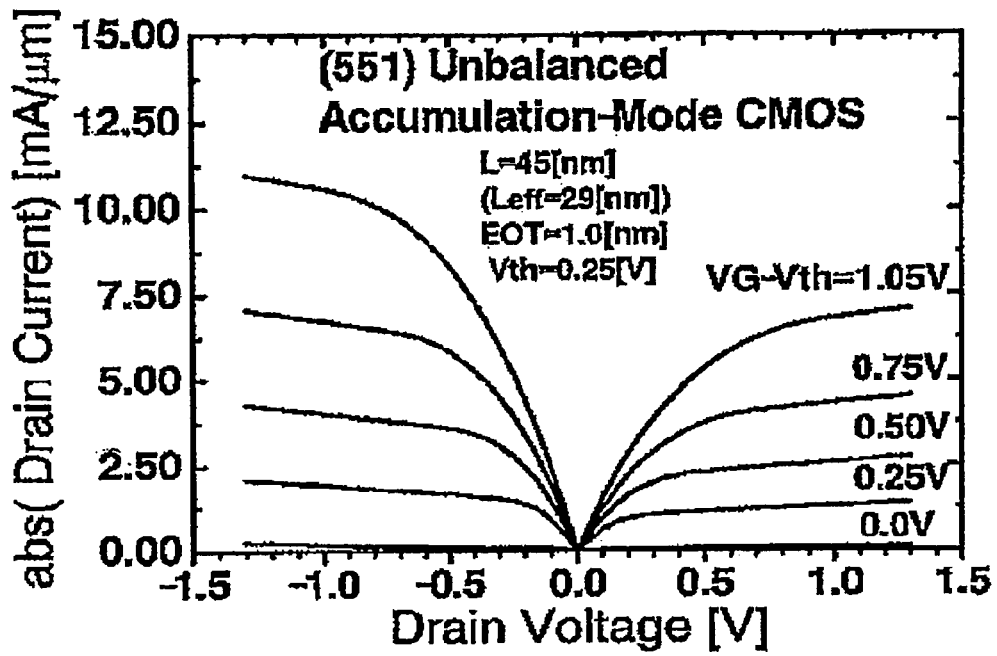
FIG. 9A is a diagram showing the current-voltage characteristics of an accumulation-mode CMOS fabricated on the (551) surface orientation.
Figure 9B:
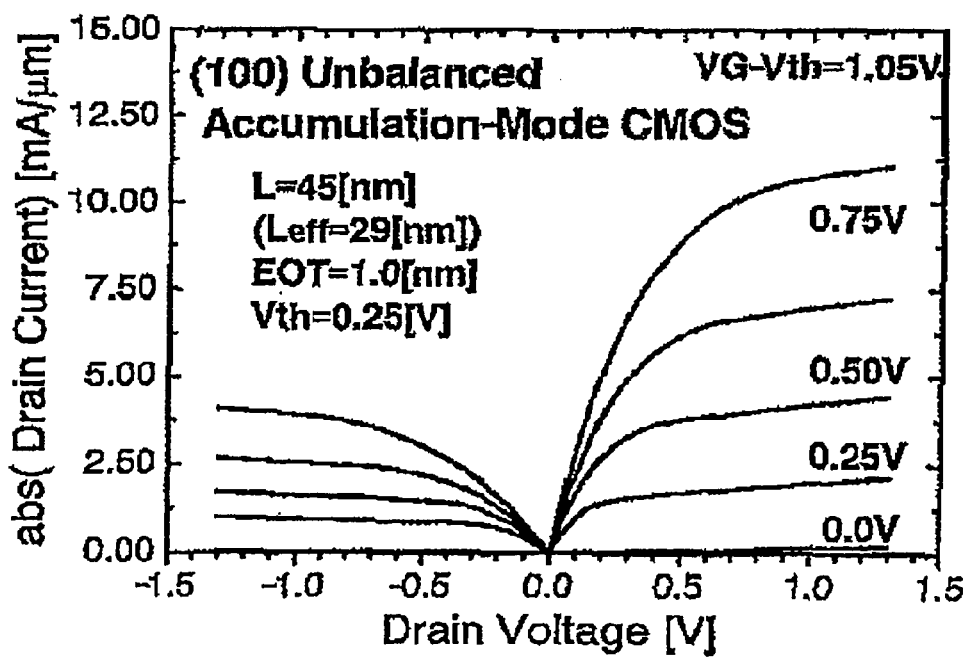
FIG. 9B is a diagram showing the current-voltage characteristics of an accumulation-mode CMOS fabricated on the (100) surface orientation.
Figure 9C:
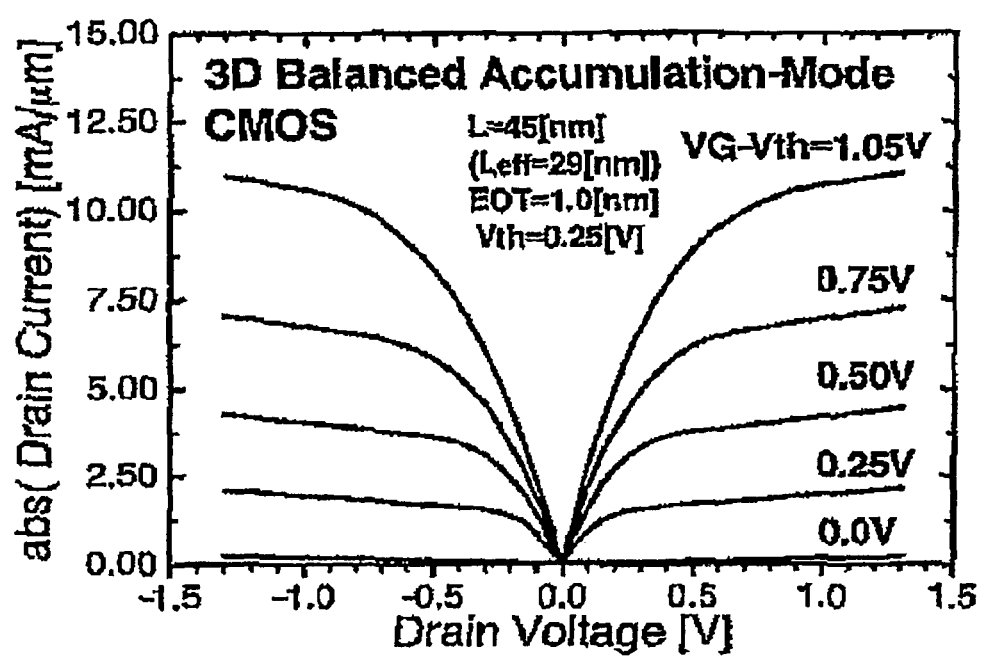
FIG. 9C is a diagram showing the current-voltage characteristics of an accumulation-mode CMOS fabricated as a three-dimensional SOI type.
Figure 10:
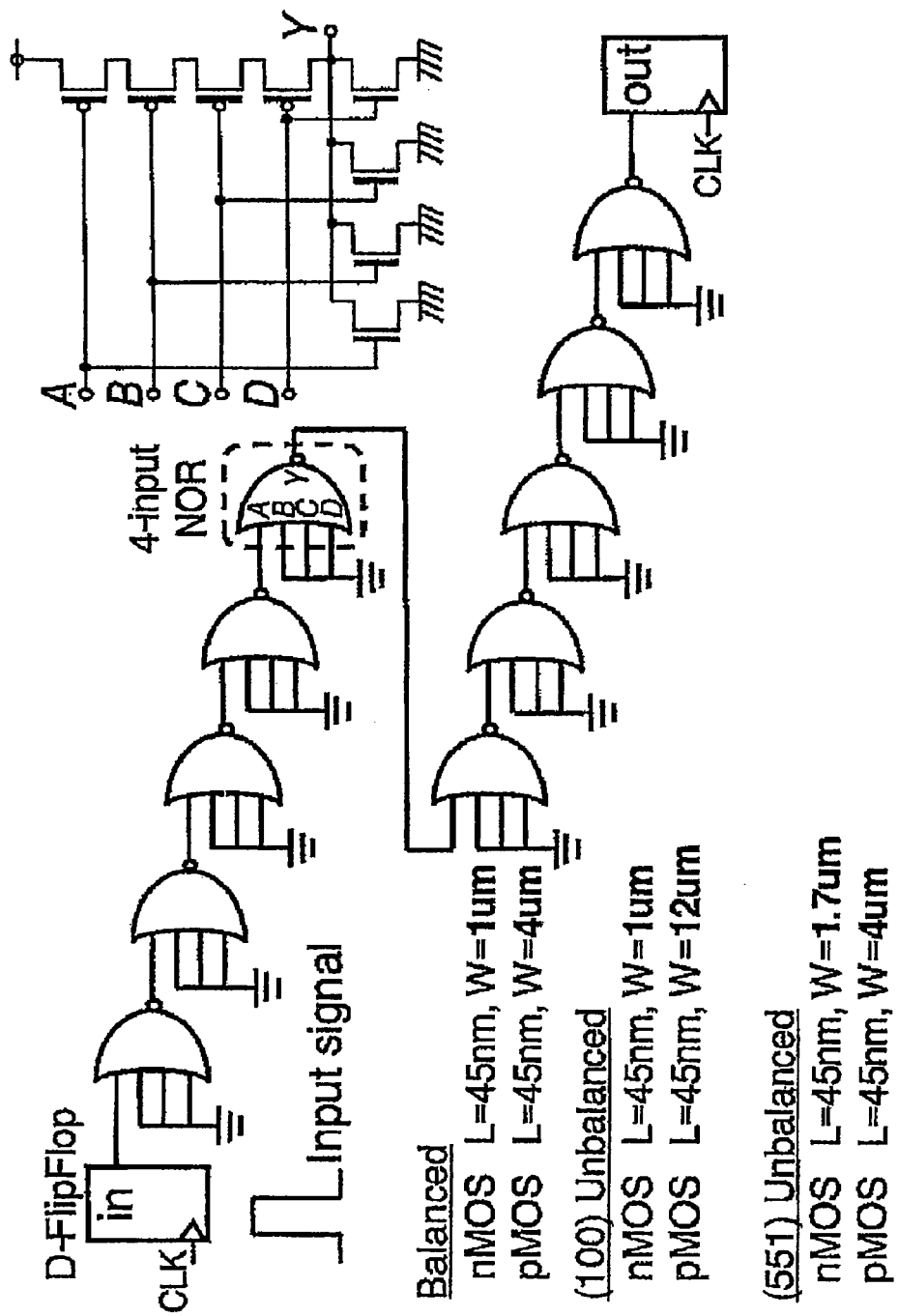
FIG. 10 is a circuit configuration diagram of a 4-input 10-stage NOR gate.
Figure 11:
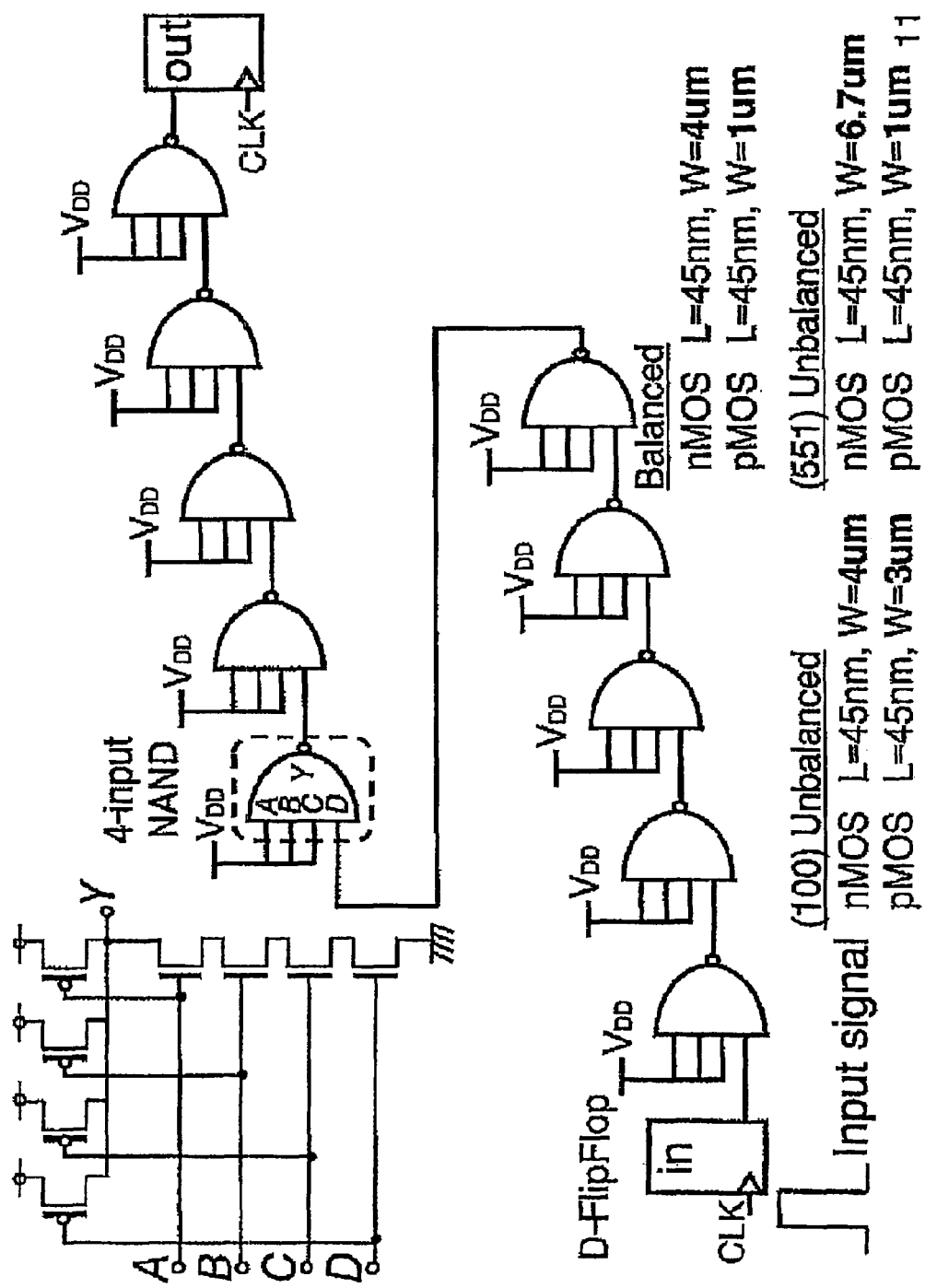
FIG. 11 is a circuit configuration diagram of a 4-input 10-stage NAND gate.
Figure 12A:
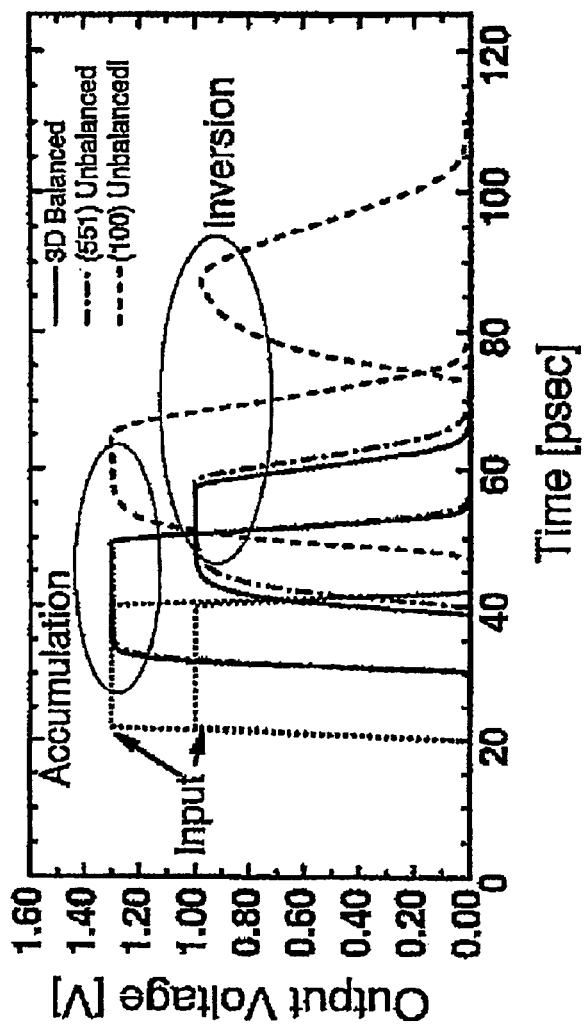
FIG. 12A is a diagram showing response waveforms, in response to 50 GHz clock signals, of 4-input 10-stage NOR gates formed by inversion-mode CMOSs and accumulation-mode CMOSs, respectively.
Figure 12B:
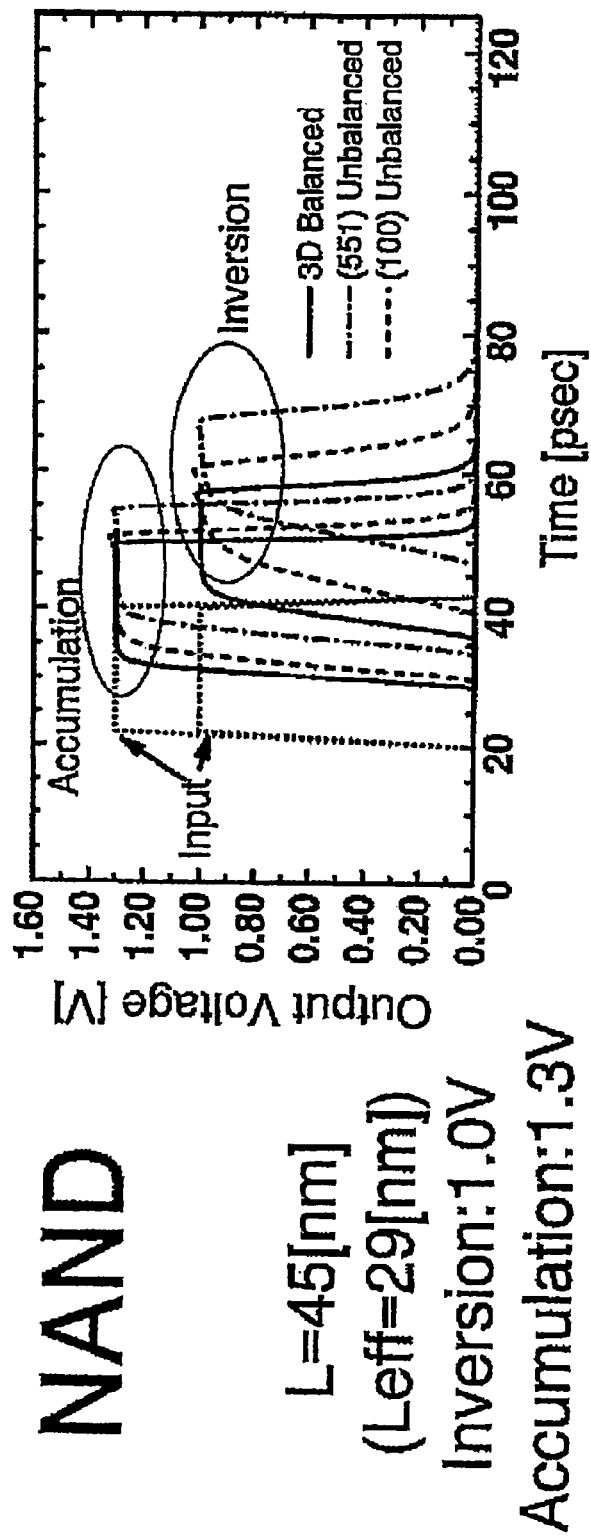
FIG. 12B is a diagram showing response waveforms, in response to 50 GHz clock signals, of 4-input 10-stage NAND gates formed by inversion-mode CMOSs and accumulation-mode CMOSs, respectively.

A second embodiment of this invention will be described referring to FIGS. 8A and 8B to FIGS. 12A and 12B. FIGS. 8A and 8B are sectional views of a semiconductor device according to the second embodiment. FIGS. 9A, 9B, and 9C show the current-voltage characteristics representing the effect of this invention. FIGS. 10 and 11 show simulation conditions for input/output waveforms of a 4-input 10-stage NOR gate and a 4-input 10-stage NAND gate, respectively, for explaining the effect of this invention, and FIGS. 12A and 12B show the results thereof.

As illustrated in FIG. 8A, there is prepared a substrate having a 10 nm-thickness, (551) surface orientation, n-type SOI (Silicon on Insulator) layer 22, separated by a 100 nm-thickness buried oxide film 21, on a support substrate 20. Herein, the (551) surface orientation is a surface orientation inclined by 8o from the (110) surface orientation. Then, as illustrated in FIG. 8B, the SOI layer 22 is etched except those portions where transistors will be formed, thereby separating the respective regions. In this event, threshold adjusting impurity implantation is performed in the respective regions, thereby carrying out substrate concentration adjustment. Phosphorus is implanted into the portion, which will be an accumulation-mode n-channel transistor, to a concentration of $3\times10^{18}$ $cm^{-3}$, while, boron is implanted into the portion, which will be an accumulation-mode p-channel transistor, to a concentration of $3\times10^{18}$ $cm^{-3}$. After cleaning, gate insulating film formation is performed using a microwave-excited plasma apparatus, thereby forming $Si_3N_4$ films 23 of 1 nm in terms of an electrical oxide film equivalent insulating film thickness. Herein, the surfaces of the channel regions have been subjected to a flattening process so as to have a peak-to-valley of 0.16 nm or less and thus the interfaces between the gate insulating films and the channel regions are extremely flat on the atomic order. As the gate insulating film, use may be made of a high permittivity material, such as a metal oxide such as $SO_2$, $H_fO_x$, $Z_rO_x$, or $La_2O_3$, or a metal nitride such as PrxSiyNz.

Thereafter, a Ta film is formed on the gate insulating films and then etched to a desired gate length and width, thereby forming gate electrodes 24. In this event, since the SOI layers are each fully depleted due to formation of a depletion layer with a thickness of about 18 nm by a work function difference between the SOI layer and the gate electrode, the accumulation-mode n-channel transistor and the accumulation-mode p-channel transistor are both normally off. Thereafter, arsenic is implanted into source and drain layers of the n-channel transistor region to a concentration of $2\times10^{20}$ $cm^{-3}$ to perform activation, while, boron is implanted into source and drain layers of the p-channel transistor region to a concentration of $2\times10^{20}$ $cm^{-3}$ to perform activation. Further, a $S_iO_2$ film is formed by CVD (Chemical Vapor Deposition) and, as wiring layers, a gate line 25, an output line 26, and power supply lines 27 and 28 are formed. In this case, drain electrodes 30, 30 and source electrodes 29, 29 are also buried in the drain regions and the source regions, respectively, so that the resistance from each electrode to the channel region becomes 1Ωμm or less, and a semiconductor layer of the source and drain regions is 2 nm in a lateral direction. Herein, in order that the contact resistance Rc between each electrode and the silicon becomes $10^{-11}$ $\Omega cm^2$ or less, the electrodes connected to the n+ silicon regions of the n-channel transistor are formed of Mg, while, the electrodes connected to the p+ silicon regions of the p-channel transistor are formed of Ir. By this, the work function difference between each electrode and the silicon region can be set to 0.2 eV or less, so that even the sum of a series resistance of each of the source and drain regions and the contact resistance is 1.0Ωμm. As a result, as compared with the case where the resistance of the source and drain regions is zero, degradation of the effective transconductance in each of the n-channel transistor and the p-channel transistor is small enough to be negligible. In the illustrated example, each of the selected electrode materials forms a silicide between itself and the silicon region.

The above CMOS may be fabricated on a surface orientation other than the (551) surface orientation. For example, it may be fabricated on an SOI layer of the (100) surface orientation. Alternatively, it may have an SOI-type three-dimensional structure described in the specification of Japanese Patent Application No. 2005-369170, wherein a p-channel transistor is fabricated only on the (110) plane where the hole mobility is large, while, an n-channel transistor is fabricated on the (110) plane, where the electron mobility is slightly inferior, with its gate formed also on the (100) plane of the side walls where the electron mobility is large, i.e. the n-channel transistor has a three-dimensional structure and the p-channel transistor has a two-dimensional structure. In this case, by selecting the channel width of the p-channel transistor and the channel width and height of the n-channel transistor, the operating speeds and the areas of the upper surfaces of the channel regions of the n-channel transistor and the p-channel transistor can be made equal to each other, respectively.

FIG. 9A shows simulation results of the current-voltage characteristics of the above accumulation-mode CMOS fabricated on the (551) surface orientation. FIG. 9B shows simulation results of the current-voltage characteristics of the above accumulation-mode CMOS fabricated on the (100) surface orientation. FIG. 9C shows simulation results of the current-voltage characteristics of the above accumulation-mode CMOS having the SOI-type three-dimensional structure in which the channel width of the p-channel transistor and the channel width and height of the n-channel transistor are selected so that the operating speeds and the areas of the upper surfaces of the channel regions of the n-channel transistor and the p-channel transistor are made equal to each other, respectively. In any case, the gate length is 45 nm, the effective channel length is 29 nm, and the channel width is 1 μm.

FIG. 12A shows, by chain lines, simulation results of output waveforms, in response to 50 GHz input waveforms, of 4-input 10-stage NOR gates formed by accumulation-mode CMOSs and inversion-mode CMOSs fabricated on the (551) surface orientation, respectively. Like FIG. 12A, FIG. 12B shows, by chain lines, simulation results of output waveforms, in response to 50 GHz input waveforms, of 4-input 10-stage NAND gates formed by accumulation-mode CMOSs and inversion-mode CMOSs, respectively. The circuit configurations of a 4-input 10-stage NOR gate and a 4-input 10-stage NAND gate are illustrated in FIGS. 10 and 11, respectively. The power supply voltage is selected under the condition that the electric field applied to a gate insulating film is allowed up to 8 MV/cm for either of the accumulation mode and the inversion mode. The power supply voltage of the accumulation-mode CMOS is set to 1.3V and the power supply voltage of the inversion-mode CMOS is set to 1.0V. In this case, as shown in FIG. 9A, the current driving capability of an n-channel transistor is about 60% of the current driving capability of a p-channel transistor in a CMOS fabricated on the (551) surface orientation. In the case of a 4-input NOR gate, for equalizing the current driving capabilities of a p-channel transistor and an n-channel transistor, it is necessary that when the gate width of the p-channel transistor is set to 4 μm, the gate width of the n-channel transistor be set to 1.7 μm. On the other hand, in the case of a 4-input NAND gate, it is necessary that when the gate width of a p-channel transistor is set to 1 μm, the gate width of an n-channel transistor be set to 6.8 μm. In this case, in the accumulation-mode CMOS on the (551) surface orientation, the maximum operating frequency as a logic circuit for the 4-input 10-stage NOR gate is 60 GHz, the maximum operating frequency as a logic circuit for the 4-input 10-stage NAND gate is 40 GHz, and the maximum operating frequency of a 4-input 10-stage random-logic LSI is 40 GHz. On the other hand, in the inversion-mode CMOS on the (551) surface orientation, the maximum operating frequency as a logic circuit for the 4-input 10-stage NOR gate is GHz, the maximum operating frequency as a logic circuit for the 4-input 10-stage NAND gate is 20 GHz, and the maximum operating frequency of a 4-input 10-stage random-logic LSI is 20 GHz. In any of the above simulations, the gate length of the transistor is 45 nm and the effective channel length thereof is 29 nm.

FIG. 12A also shows, by broken lines, simulation results of output waveforms, in response to 50 GHz input waveforms, of 4-input 10-stage NOR gates formed by accumulation-mode CMOSs and inversion-mode CMOSs fabricated on the (100) surface orientation, respectively. Like FIG. 12A, FIG. 12B shows, by broken lines, simulation results of output waveforms, in response to 50 GHz input waveforms, of 4-input 10-stage NAND gates formed by accumulation-mode CMOSs and inversion-mode CMOSs, respectively. The power supply voltage of the accumulation-mode CMOS is set to 1.3V and the power supply voltage of the inversion-mode CMOS is set to 1.0V. In this case, as shown in FIG. 9B, the current driving capability of a p-channel transistor is about 30% of the current driving capability of an n-channel transistor in a CMOS fabricated on the (100) surface orientation. Therefore, in the case of a 4-input NOR gate, for equalizing the current driving capabilities of a p-channel transistor and an n-channel transistor, it is necessary that when the gate width of the n-channel transistor is set to 1 μm, the gate width of the p-channel transistor be set to 12 μm. On the other hand, in the case of a 4-input NAND gate, it is necessary that when the gate width of an n-channel transistor is set to 4 μm, the gate width of a p-channel transistor be set to 3 μm. In this case, in the accumulation-mode CMOS on the (100) surface orientation, the maximum operating frequency as a logic circuit for the 4-input 10-stage NOR gate is 20 GHz, the maximum operating frequency as a logic circuit for the 4-input 10-stage NAND gate is 50 GHz, and the maximum operating frequency of a 4-input 10-stage random-logic LSI is 20 GHz. On the other hand, in the inversion-mode CMOS on the (100) surface orientation, the maximum operating frequency as a logic circuit for the 4-input 10-stage NOR gate is 10 GHz, the maximum operating frequency as a logic circuit for the 4-input 10-stage NAND gate is 25 GHz, and the maximum operating frequency of a 4-input 10-stage random-logic LSI is 10 GHz. In any of the above simulations, the gate length of the transistor is 45 nm and the effective channel length thereof is 29 nm.

FIG. 12A further shows, by solid lines, simulation results of output waveforms, in response to 50 GHz input waveforms, of 4-input 10-stage NOR gates formed by accumulation-mode CMOSs and inversion-mode CMOSs each fabricated so that the operating speeds and the areas of an n-channel and a p-channel are equal to each other using the above three-dimensional SOI structure. Like FIG. 12A, FIG. 12B shows, by solid lines, simulation results of output waveforms, in response to 50 GHz input waveforms, of 4-input 10-stage NAND gates formed by accumulation-mode CMOSs and inversion-mode CMOSs, respectively. The power supply voltage of the accumulation-mode CMOS is set to 1.3V and the power supply voltage of the inversion-mode CMOS is set to 1.0V. In this case, as shown in FIG. 9C, the current driving capability of an n-channel transistor is substantially equal to the current driving capability of a p-channel transistor in a three-dimensional SOI structure CMOS. Therefore, in the case of a 4-input NOR gate, for equalizing the current driving capabilities of a p-channel transistor and an n-channel transistor, it is necessary that when the gate width of the n-channel transistor is set to 1 μm, the gate width of the p-channel transistor be set to 4 μm. On the other hand, in the case of a 4-input NAND gate, it is necessary that when the gate width of an n-channel transistor is set to 4 μm, the gate width of a p-channel transistor be set to 1 μm. In this case, in the three-dimensional SOI structure accumulation-mode CMOS, the maximum operating frequency as a logic circuit for the 4-input 10-stage NOR gate is 60 GHz, the maximum operating frequency as a logic circuit for the 4-input 10-stage NAND gate is 60 GHz, and the maximum operating frequency of a 4-input 10-stage random-logic LSI is 60 GHz. On the other hand, in the inversion-mode CMOS on the (551) surface orientation, the maximum operating frequency as a logic circuit for the 4-input 10-stage NOR gate is 30 GHz, the maximum operating frequency as a logic circuit for the 4-input 10-stage NAND gate is 30 GHz, and the maximum operating frequency of a 4-input 10-stage random-logic LSI is 30 GHz. In any of the above simulations, the gate length of the transistor is 45 nm and the effective channel length thereof is 29 nm.

As shown in FIGS. 12A and 12B, when a comparison is made in terms of the same CMOS structure, it has been made clear that the operating speed is dramatically improved by forming the CMOSs using the accumulation-mode transistors in which the substrate concentration in a semiconductor layer is higher than $2 \times 10^{17}$ cm$^{-3}$, as compared with the case where the CMOSs are formed by the inversion-mode transistors.

INDUSTRIAL APPLICABILITY

While the description has been given of accumulation-mode n-channel and p-channel transistors in which the substrate concentration in a semiconductor layer is higher than $2 \times 10^{17}$ cm$^{-3}$, and CMOS circuits (semiconductor devices) formed by these transistors, this invention is not limited thereto, but is also applicable to various elements and electronic circuits.

The invention claimed is:

1. An accumulation-mode transistor comprising a channel region and a source region and a drain region formed at both ends of said channel region, wherein said channel region has an impurity concentration higher than $2 \times 10^{17}$ cm$^{-3}$ and said channel region is formed of an n-type semiconductor with electrons used as carriers or is formed of a p-type semiconductor with holes used as carriers,
   wherein an electric field applied to a gate insulating film when a gate voltage corresponding to a threshold value is applied is 0 MV/cm or less and directions of effective electric fields applied to the gate insulating film and the channel are opposite to each other, respectively, in the on and off states of the transistor, and
   wherein said source region and said drain region are formed of a metal or a metal-semiconductor compound having a work function with a difference of 0.32 eV or less with respect to a work function of the semiconductor of said channel region.

2. An accumulation-mode transistor according to claim 1, wherein said source region and said drain region are formed of a semiconductor of the same conductivity type as that of said channel region.

3. An accumulation-mode transistor according to claim 1, wherein said channel region is formed of n-type silicon and said source region and said drain region are formed of a metal or a metal-semiconductor compound having a work function of −4.37 eV or more.

4. An accumulation-mode transistor according to claim 1, wherein said channel region is formed of p-type silicon and said source region and said drain region are formed of a metal or a metal-semiconductor compound having a work function of −4.95 eV or less.

5. An accumulation-mode transistor according to claim 1, wherein said transistor is of a normally-off type.

6. An accumulation-mode transistor according to claim 5, wherein said channel region is formed of an SOI layer and a thickness of said SOI layer is smaller than the thickness of a depletion layer which is formed in a semiconductor layer of said channel region at a contact portion between said channel region and said source region when a voltage applied to the drain electrode changes from 0V to a power supply voltage while a voltage applied to the gate electrode is equal to a voltage applied to the source electrode.

7. An accumulation-mode transistor according to claim 6, wherein the thickness of said SOI layer, an impurity concentration of said SOI layer, and a work function of the gate electrode over said channel region are determined in such a manner that the depletion layer formed in the semiconductor layer of said channel region at the contact portion between said channel region and said source region by a work function difference between the gate electrode provided on the gate insulating film and the semiconductor layer of said channel region is formed continuously in a depth direction of said semiconductor layer when the voltage applied to the drain electrode changes from 0V to the power supply voltage while the voltage applied to the gate electrode is equal to the voltage applied to the source electrode.

8. An accumulation-mode transistor according to claim 1, wherein the impurity concentration of said channel region is $1 \times 10^{18}$ cm$^{-3}$ to $5 \times 10^{19}$ cm$^{-3}$.

9. An accumulation-mode CMOS semiconductor device including at least two transistors each according to claim 1, wherein one of the two transistors is an n-channel transistor and the other is a p-channel transistor.

10. An accumulation-mode CMOS semiconductor device according to claim 9, wherein at least a part of a channel region of each of said n-channel transistor and said p-channel transistor has a (100) plane or a plane within ±10° from the (100) plane.

11. An accumulation-mode CMOS semiconductor device according to claim 9, wherein at least a part of a channel region of each of said n-channel transistor and said p-channel transistor has a (110) plane or a plane within ±10° from the (110) plane.

12. An accumulation-mode CMOS semiconductor device according to claim 9, wherein at least a part of a channel region of said n-channel transistor has a (100) plane or a plane within ±10° from the (100) plane and at least a part of a channel region of said p-channel transistor has a (110) plane or a plane within ±10° from the (110) plane.

* * * * *